US008270530B2

United States Patent

(12) United States Patent
Hamada et al.

(10) Patent No.: US 8,270,530 B2
(45) Date of Patent: Sep. 18, 2012

(54) APPARATUS AND METHOD OF COMPENSATING DISTORTION

(75) Inventors: Hajime Hamada, Kawasaki (JP); Hiroyoshi Ishikawa, Kawasaki (JP); Yuichi Utsunomiya, Kawasaki (JP); Kazuo Nagatani, Kawasaki (JP); Nobukazu Fudaba, Kawasaki (JP); Hideharu Shako, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 598 days.

(21) Appl. No.: 12/555,314

(22) Filed: Sep. 8, 2009

(65) Prior Publication Data

US 2010/0060355 A1 Mar. 11, 2010

(30) Foreign Application Priority Data

Sep. 10, 2008 (JP) ................................ 2008-232294

(51) Int. Cl.
*H04L 25/03* (2006.01)

(52) U.S. Cl. ........................................ 375/296; 295/297

(58) Field of Classification Search .................. 375/259, 375/285, 295, 296, 297; 332/124, 125, 149, 332/160

See application file for complete search history.

(56) References Cited

U.S. PATENT DOCUMENTS

| | | | | |
|---|---|---|---|---|
| 6,400,774 | B1 * | 6/2002 | Matsuoka et al. | 375/295 |
| 7,012,969 | B2 * | 3/2006 | Ode et al. | 375/296 |
| 7,545,880 | B1 | 6/2009 | Coons et al. | |
| 2001/0050592 | A1 | 12/2001 | Wright et al. | |
| 2002/0079965 | A1 * | 6/2002 | Maniwa et al. | 330/149 |
| 2005/0168283 | A1 | 8/2005 | Suzuki et al. | |
| 2005/0180527 | A1 | 8/2005 | Suzuki et al. | |
| 2005/0226346 | A1 * | 10/2005 | Ode et al. | 375/296 |
| 2006/0232332 | A1 | 10/2006 | Braithwaite | |

FOREIGN PATENT DOCUMENTS

| | | |
|---|---|---|
| EP | 1 560 329 | 8/2005 |
| JP | 2001-268150 | 9/2001 |
| JP | 2002-335129 | 11/2002 |
| JP | 2005-253045 | 9/2005 |
| WO | 01/08296 | 2/2001 |

OTHER PUBLICATIONS

European Search Report dated Feb. 4, 2010, from the corresponding European Application.

V. J. Mathews, et al., "Polynomial Signal Processing", May 15, 2000, pp. 68-75, John Wiley & Sons, Inc. (2000).

S. Haykin, "Adaptive Filter Theory", Jan. 17, 1996, pp. 364-373 & 562-573, Prentice Hall, Inc. (1996).

V. J. Mathews, "Adaptive Polynomial Filters", Jul. 1, 1991, pp. 10-26, IEEE Signal Processing Magazine.

* cited by examiner

*Primary Examiner* — Tesfaldet Bocure

(74) *Attorney, Agent, or Firm* — Katten Muchin Rosenman LLP

(57) ABSTRACT

A distortion compensating apparatus includes a processing circuit that calculates each of a plurality of series operation coefficient pairs based on a transmission signal and a feedback signal of an output from an amplifying circuit performing power amplification of the transmission signal, executes a series operation process with respect to the transmission signal based on the plurality of the series operation coefficient pairs as a distortion compensation of the transmission signal, and inputs a result of the series operation process to the amplifying circuit performing the power amplification, and a selecting unit that, on the basis of power of the transmission signal, selects the series operation process to be executed corresponding to one of the plurality of series operation coefficient pairs, or selects one of the plurality of series operation coefficient pairs to be used in the series operation process to be executed.

20 Claims, 13 Drawing Sheets

301
302(#3)
$a_3x+b_3x^3+c_3x^5+d_3x^7$
302(#2)
$a_2x+b_2x^3+c_2x^5+d_2x^7$
302(#1)
$a_1x+b_1x^3+c_1x^5+d_1x^7$
AMPLIFIER REVERSE CHARACTERISTIC (GAIN)
FIRST THRESHOLD VALUE
SECOND THRESHOLD VALUE
INPUT POWER

TRANSMISSION SIGNAL
404
PD UNIT
TO D/A
402
SELECTOR
401(#1)
COEFFICIENT MEMORY UNIT
$a_1, b_1, c_1, d_1$
401(#2)
COEFFICIENT MEMORY UNIT
$a_2, b_2, c_2, d_2$
401(#N)
COEFFICIENT MEMORY UNIT
$a_N, b_N, c_N, d_N$
403
POWER CONVERTING UNIT

THRESHOLD VALUE
OPTIMAL THRESHOLD VALUE
GOOD SIGNAL QUALITY BAD

FIRST COEFFICIENT UPDATING UNIT ... $\mu_1 \propto \frac{1}{\text{AREA A}}$

SECOND COEFFICIENT UPDATING UNIT ... $\mu_2 \propto \frac{1}{\text{AREA B}}$

THIRD COEFFICIENT UPDATING UNIT ... $\mu_3 \propto \frac{1}{\text{AREA C}}$ 1202
1201
1203
FREQUENCY
POWER

APPARATUS AND METHOD OF COMPENSATING DISTORTION

CROSS-REFERENCE TO RELATED APPLICATION

This application is based upon and claims the benefit of priority of the prior Japanese Patent Application No. 2008-232294, filed on Sep. 10, 2008, the entire contents of which are incorporated herein by reference.

FIELD

Embodiments of the present invention relate to a pre-distortion (hereinafter, simply referred to as PD)-type distortion compensating scheme in digital wireless communication that executes a digital process on a signal before it is input to a transmission amplifier, thereby suppressing nonlinear distortion of an output from the transmission amplifier.

BACKGROUND

In general, high-efficiency transmission amplifiers used in a wireless communication apparatus, such as a mobile object base station, has a strong nonlinear characteristic. For this reason, when a modulation signal for high-speed wireless communication is transmitted, nonlinear distortion in the transmission amplifier generates out-of-band radiant power in a transmission modulation signal and affects an adjacent transmission channel.

As a scheme for suppressing the out-of-band radiant power by the transmission amplifier, a pre-distortion scheme has been known, in which a distortion signal having a reverse characteristic of a nonlinear distortion characteristic of a transmission amplifier is added to an input signal and the input signal is input to the transmission amplifier, thereby compensating for nonlinear distortion in the transmission amplifier. In particular, an adaptive pre-distortion scheme where an output of a transmission amplifier is fed back to the input side and distortion compensation is adaptively performed may greatly suppress the out-of-band radiant power.

FIG. 11 is a diagram illustrating a principle of a pre-distortion scheme. In general, in the transmission amplifier, an output is saturated as input power increases, and a linear signal may not be output with respect to an input signal (refer to reference numeral 1101 of FIG. 11). The nonlinear characteristic of the amplifier causes the following problems.

FIG. 12 is a diagram illustrating the case where a spectrum characteristic is deteriorated due to a nonlinear characteristic of a transmission amplifier.

As illustrated in FIG. 12, according to the nonlinear characteristic of the transmission amplifier, with respect to an amplifier input 1201, an unnecessary spectrum 1203 is radiated, in addition to a signal band 1202. The out-of-band radiant power deteriorates a characteristic of another system using an output-of-band frequency.

In FIG. 12, although shielded in a signal characteristic, even in the signal band 1202, an unnecessary spectrum is radiated. This causes characteristic deterioration of the signal.

Further, in most of current digital modulation schemes, a linear amplification characteristic is needed. For this reason, in the case of using the amplifier that has the saturation characteristic as described above, a linear low input power portion needs to be used. This leads to a decrease in power efficiency of the transmission amplifier.

Accordingly, a reverse characteristic of an amplifier characteristic is applied to an input signal of the transmission amplifier using a pre-distortion technique (refer to reference numeral 1102 of FIG. 11). In this case, if a nonlinear amplifier characteristic is additionally applied, a compensated linear characteristic may be obtained at the output of the transmission amplifier, as illustrated by reference numeral 1103 of FIG. 11.

As an example of the pre-distortion scheme, a pre-distortion scheme using a power series has been suggested. In this pre-distortion scheme, as illustrated in FIG. 13, a compensation operation in a pre-distortion unit 1301 at a previous stage of the transmission amplifier is performed by a power series operation with respect to an input signal x.

That is, in FIG. 13, the pre-distortion unit 1301 executes the power series operation with respect to the input signal x, thereby compensating for distortion of a transmission amplifier 1305.

An output of the pre-distortion unit 1301 is converted into an analog signal in a D/A converter 1302. Further, the output is orthogonally modulated by a signal oscillated by a local oscillator 1304 according to a transmission base station, in an orthogonal modulator 1303.

The modulated transmission analog signal is power amplified in the transmission amplifier 1305, and an output thereof is supplied to a transmission antenna 1307 through a coupler 1306 and is then transmitted from the transmission antenna.

Further, the output of the transmission amplifier 1305 is fed back from the coupler 1306 to the input side.

That is, an output of the coupler 1306 is down converted according to the signal oscillated from the local oscillator 1309 according to the transmission base station, in a down converter 1308. After the output becomes a digital signal by an A/D converter 1310, the output becomes a base band signal in a demodulator.

As a result, with respect to an obtained feedback signal Sfb(n), an error signal e(n) with a transmission signal Sref(n) that is delayed in a delay circuit is calculated by a subtractor 1311.

In addition, power series operation coefficients a, b, c, and d that are supplied to the pre-distortion unit 1301 are updated by a coefficient updating unit 1312, such that the error signal e(n) is minimized on the basis of a least mean square (LMS) operation.

In this way, the power series operation coefficients are gradually converged to a predetermined value, and a power series operation is performed with respect to the input signal x by the pre-distortion unit 1301 using the power series operation coefficients converged to the predetermined value. As a result, in a normal state, a nonlinear distortion characteristic of an analog circuit unit is suppressed with high precision while high power efficiency is maintained. In addition, even when the nonlinear distortion characteristic is varied due to a temperature or a frequency, a variation amount of an analog gain is detected by the feedback signal Sfb(n), and values of the power series operation coefficients are updated by the coefficient updating unit 1312 to compensate for the variation amount. As a result, it is possible to dynamically compensate for the variation in characteristic.

Further, the above configuration actually has the configuration with respect to a complex signal.

In the configuration according to the related art, for example, as represented by the following Equation 1, it is assumed that two sine-wave signals (2 tone signals), which are away from each other by a frequency 2Δf, are input to an amplifier model where modeling is made in a power series.

$$\cos 2\pi(fc-\Delta f)t+\cos 2\pi(fc+\Delta f)t \text{ (fc: carrier frequency)} \quad (1)$$

As a result, in an output signal that is represented by a power series, in an even-ordered power term, only a signal component that is largely-detuned from the carrier frequency fc and is suppressed by a transmission amplifier or a filter of an analog unit is included. Meanwhile, in a third power term, in the vicinity of a carrier frequency, that is, fc±3Δf, an unnecessary component is generated, and in a fifth power term, in the vicinity of a carrier frequency, that is, fc±5Δf, an unnecessary component is generated. Accordingly, the nonlinear distortion in the transmission amplifier 1305 may be modeled by a power series, which is composed of only an odd-ordered power term. In addition, as illustrated in FIG. 13, a power series that is operated by the pre-distortion unit 1301 is generally composed of only an odd-ordered power term.

Hereinafter, for convenience of explanation, a description is made using a simple power series expression like $ax+bx^3+cx^5+dx^7$, as a power series expression. However, in an actual distortion compensation, in order to more accurately model a characteristic of the transmission amplifier 1305, a complex series in consideration of a delay component starting from a Volterra series is generally used (for example, V. J. Mathews and G. L. Sicuranza: "Polynomial Signal Processing", John Wiley & Sons, Inc. (2000)).

However, in the pre-distortion-type distortion compensating scheme using the power series scheme according to the related art illustrated in FIG. 13, in a base station system that requires a signal having small distortion, distortion component suppression performance (distortion compensation performance) is not sufficient. This is because it is difficult to optimally approximate a nonlinear distortion characteristic over a wide range of input voltages using a single power series model, in the transmission amplifier 1305 that needs large power.

SUMMARY

According to an aspect of the embodiments discussed herein, a distortion compensating apparatus includes a processing circuit that calculates each of a plurality of series operation coefficient pairs based on a transmission signal and a feedback signal of an output from an amplifying circuit performing power amplification of the transmission signal, executes a series operation process with respect to the transmission signal based on the plurality of the series operation coefficient pairs as a distortion compensation of the transmission signal, and inputs a result of the series operation process to the amplifying circuit performing the power amplification, and a selecting unit that, on the basis of power of the transmission signal, selects the series operation process to be executed corresponding to one of the plurality of series operation coefficient pairs, or selects one of the plurality of series operation coefficient pairs to be used in the series operation process to be executed.

It is to be understood that both the foregoing general description and the following detailed description are exemplary and explanatory, and are not restrictive of the embodiments as claimed.

DESCRIPTION OF EMBODIMENTS

Hereafter, embodiments of the present invention will be described in detail with reference to the appended drawings.

(First Embodiment)

Figure 1:
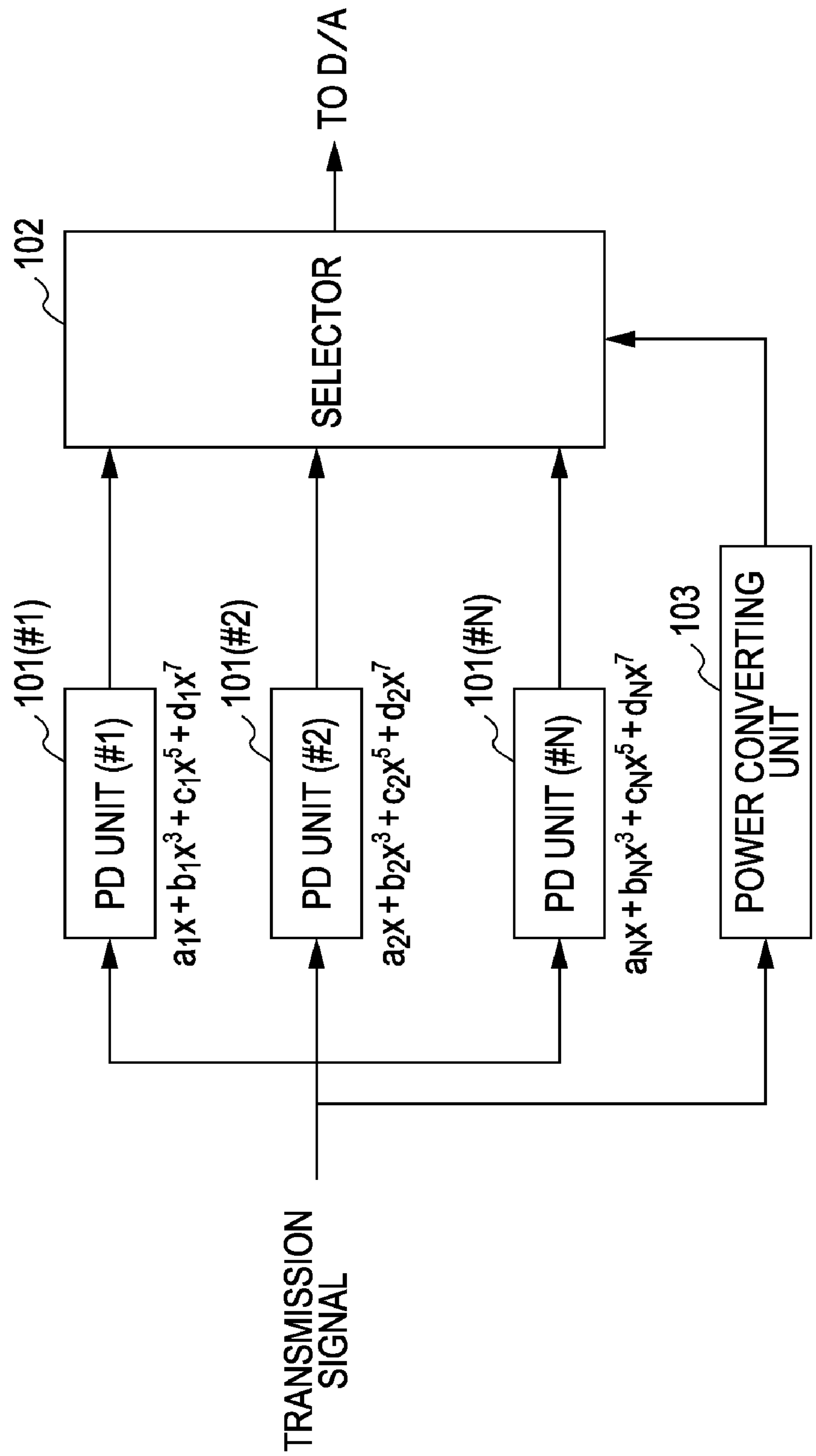
FIG. 1 is a diagram illustrating the configuration of a first embodiment.

FIG. 1 is a diagram illustrating the configuration of a first embodiment. An aspect of a distortion compensating apparatus according to the first embodiment has the following configuration.

A series operation processing unit 101 executes a series operation process corresponding to each of a plurality of series operation coefficient pairs with respect to a transmission signal. A selector 102 selects one of the plurality of series operation processes in the series operation processing unit on the basis of power of the transmission signal, and inputs the operation result to a circuit performing power amplification.

Specifically, a plurality of pre-distortion units (PD units) 101 (#1 to #N) that perform a power series operation are prepared. Each of the PD units 101 executes a different power series operation on the basis of a different power series operation coefficient pair.

The selector 102 holds (N−1) power threshold values, sequentially (Step S203 of FIG. 2) converts power of a transmission signal by a power converting unit 103 from a minimum threshold value Th(1) (Step S201 of FIG. 2) to a maximum threshold value Th(N−1) (Step S204 of FIG. 2), compares (Step S202 of FIG. 2) the obtained power signal values with the threshold values Th(i) ($1 \leqq i \leqq N-1$), and selects the PD unit 101 of #i at a point in time when it is determined that a power signal value is smaller than the threshold values Th(i). Further, when it is determined that the power signal value is equal to or larger than the threshold value Th(N−1), the PD unit 101 of #N is selected (Step S204 of FIG. 2→S206). In addition, the selector 102 outputs an output of the selected PD unit 101 to a D/A converter at a subsequent stage.

Figure 13:
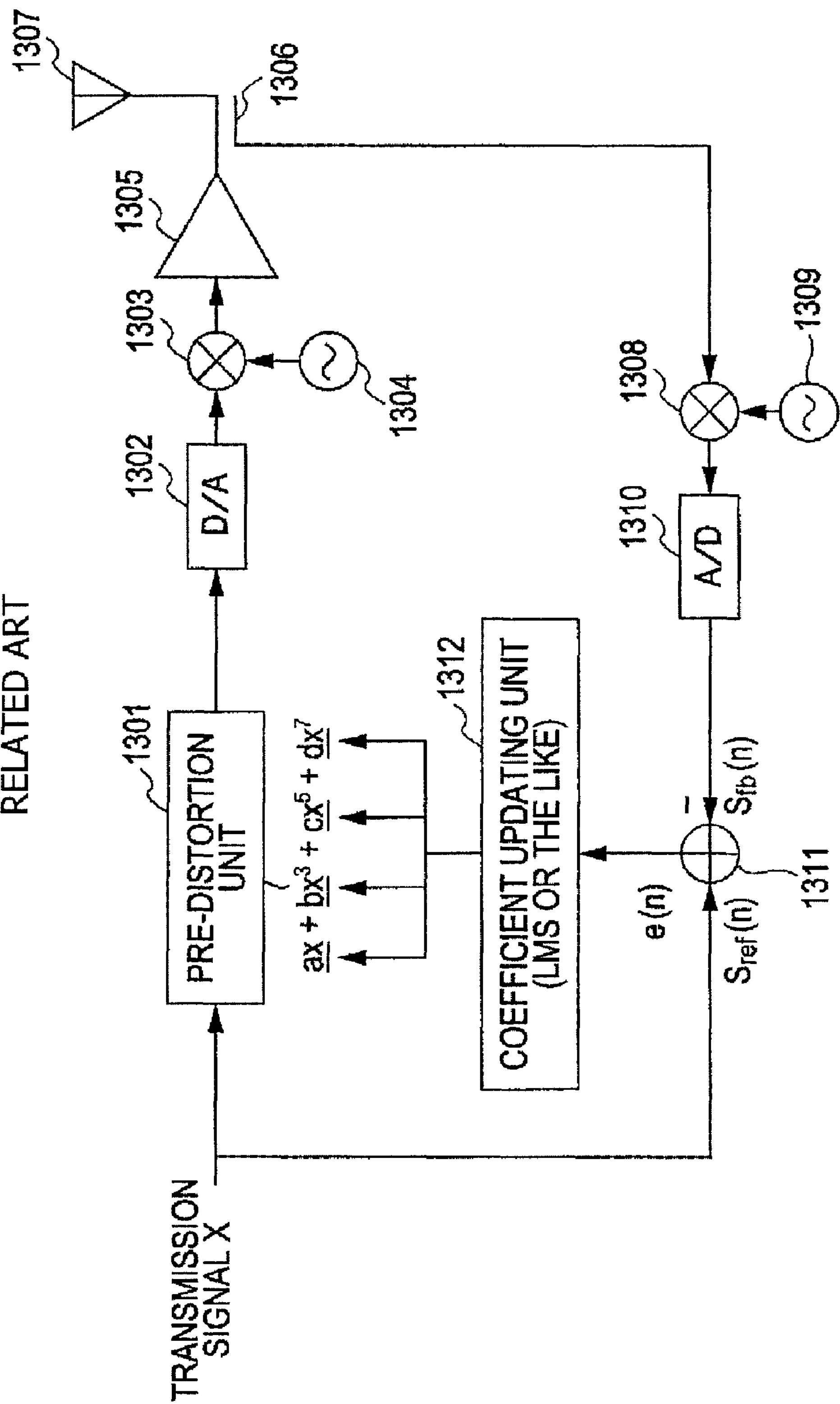
FIG. 13 is a diagram illustrating the configuration of a distortion compensating apparatus according to the related art.

The configuration of a D/A converter, an orthogonal modulator, a transmission amplifier, and a coupler of a subsequent stage portion of a forward system, and a down converter and an A/D converter of a feedback system are the same as the configuration illustrated in FIG. 13.

Figure 3:
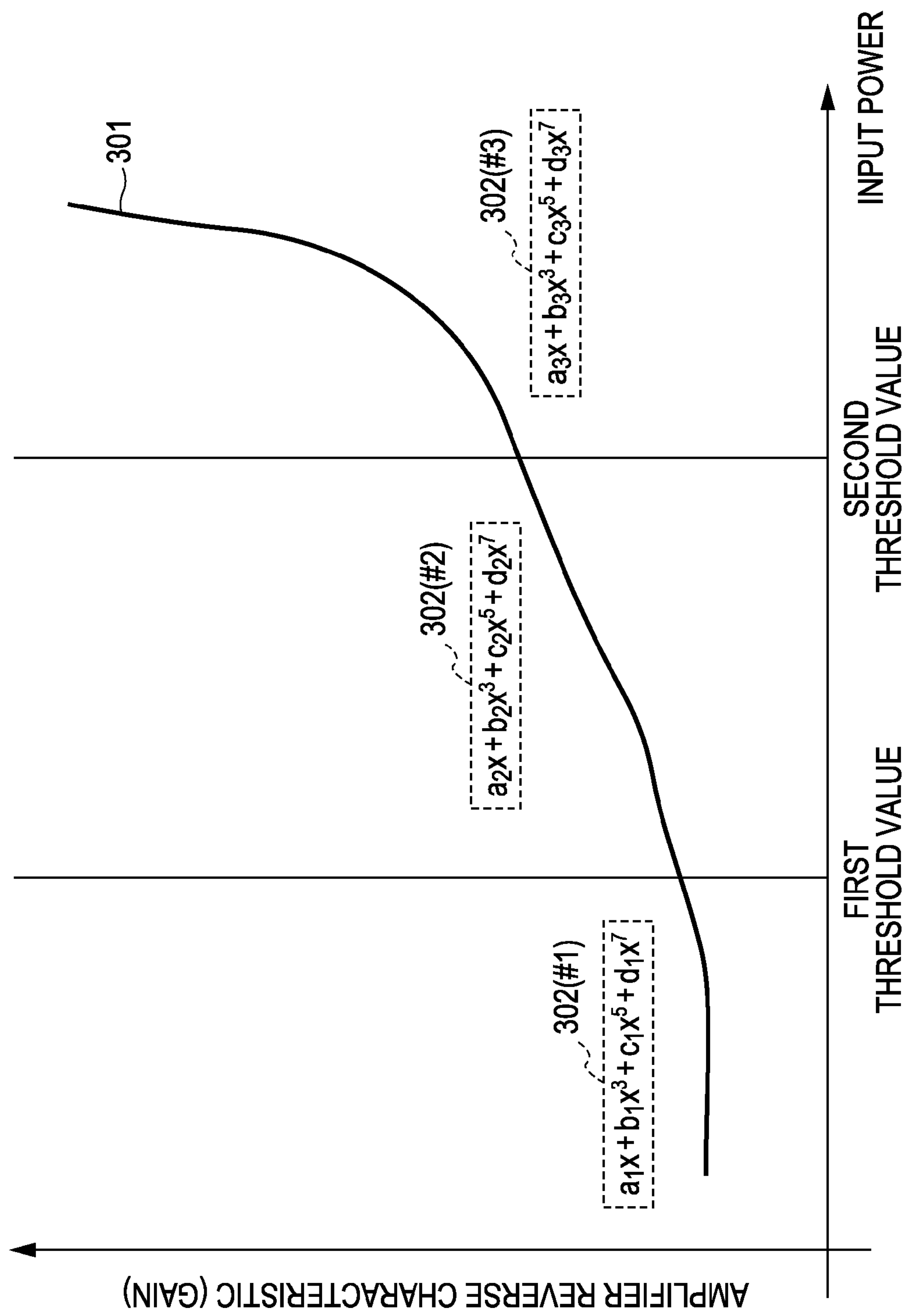
FIG. 3 is a conceptual diagram illustrating a distortion compensation using a plurality of power series (diagram illustrating an example of an amplifier reverse characteristic (gain characteristic) with respect to input power)

FIG. 3 is a conceptual diagram illustrating a distortion compensation using a plurality of power series, which illustrates an example of an amplifier reverse characteristic (gain characteristic) with respect to input power.

An amplifier reverse characteristic 301 that is simulated using a power series illustrates a significantly complex curve in an actual transmission amplifier. When the amplifier reverse characteristic is represented using one power series, an error is increased. Accordingly, in the configuration according to the first embodiment that is illustrated in FIG. 1, as illustrated in FIG. 3, in a (converted) power value of a transmission signal, one or more threshold values, such as 1 and 2, are set. In addition, in each of input power intervals that are divided by the threshold values, a distortion compensation operation is executed using a different power series 302, such as #1, #2 or #3.

As a result, in the distortion compensation operation, as compared with the case where a power series is independently used, a characteristic similar to the amplifier reverse characteristic 301 may be securely modeled, and distortion compensation performance may be improved.

(Second Embodiment)

Figure 4:
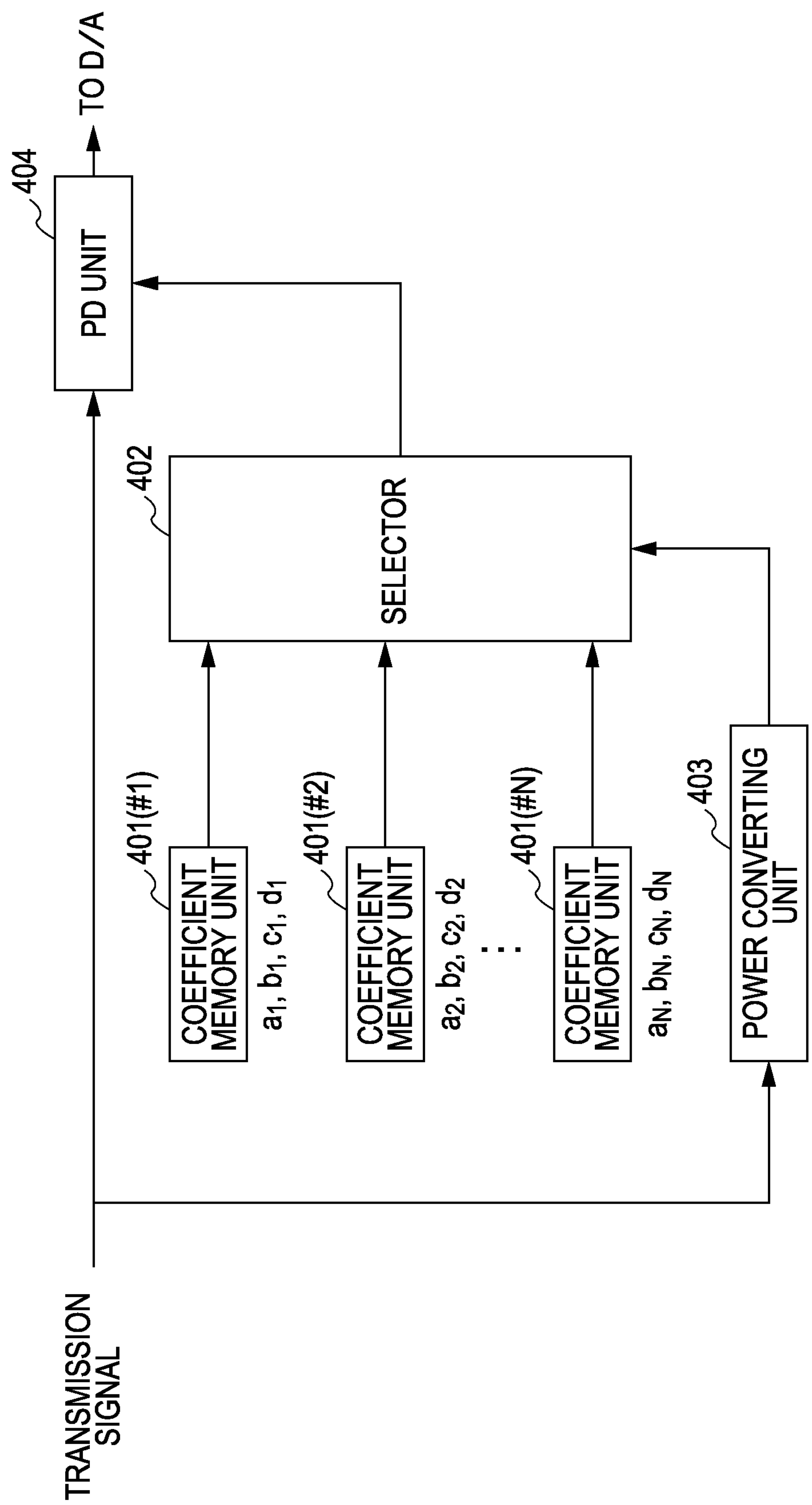
FIG. 4 is a diagram illustrating the configuration of a second embodiment.

FIG. 4 is a diagram illustrating the configuration of a second embodiment. An aspect of a distortion compensating apparatus according to the second embodiment has the following configuration.

A series operation coefficient pair storage unit 401 stores each of a plurality of series operation coefficient pairs. A selector 402 selects one of the plurality of series operation coefficient pairs from the series operation coefficient pair storage unit on the basis of power of a transmission signal, and executes a series operation process according to the selected series operation coefficient pair.

The basic operation principle is the same as that of the first embodiment illustrated in FIG. 1. However, in the configuration of FIG. 4, only one pre-distortion unit (PD unit) 404 that performs a power series operation is prepared. Instead, a plurality of coefficient memory units 401 (#1 to #N) that store power series operation coefficient pairs are prepared. In addition, the PD unit 404 executes a power series operation using a power series operation coefficient pair that is output from the coefficient memory unit 401 selected by the selector 402.

Figure 2:
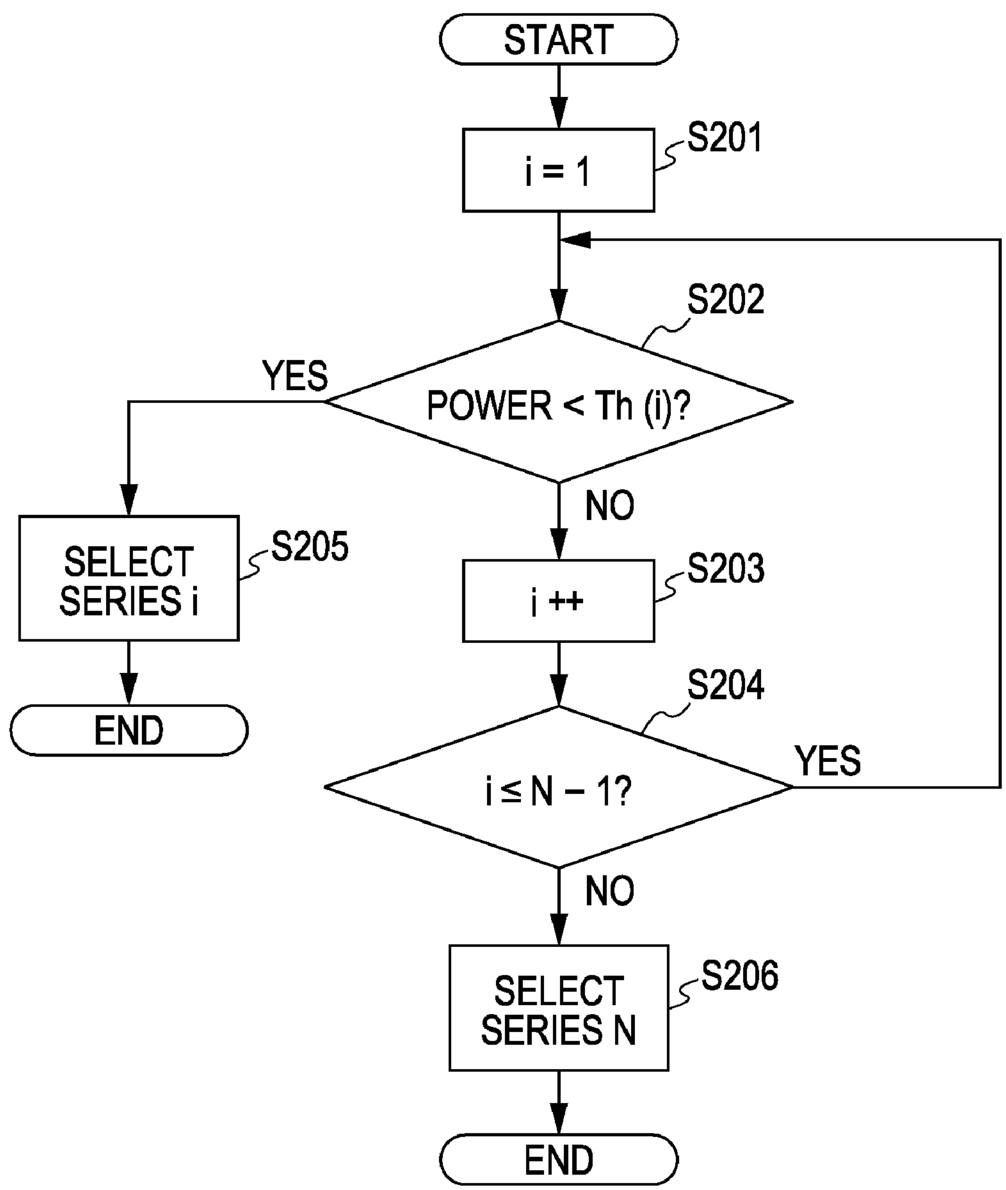
FIG. 2 is an operation flowchart illustrating a selection operation of a power series using a selector.

In addition, in the same way as the case of the selector 102 of FIG. 1, in accordance with the operation flowchart illustrated in FIG. 2, the selector 402 compares transmission signal power values output from the power converting unit 403 of FIG. 4 with (N−1) power threshold values Th(i) ($1 \leqq i \leqq N-1$), selects one of the plurality of coefficient memory units 401 (#1 to #N), and supplies a power series operation coefficient pair, which is output from the selected coefficient memory unit 401, to the PD unit 404.

The PD unit 404 executes a power series operation using the power series operation coefficient pair that is supplied from the selector 402, and an output thereof is output to a D/A converter at a subsequent stage. The configuration of a D/A converter, an orthogonal modulator, a transmission amplifier, and a coupler of a subsequent stage portion of a forward system, and a down converter and an A/D converter of a feedback system are the same as the configuration illustrated in FIG. 13.

In the configuration according to the second embodiment that is illustrated in FIG. 4, since a power series operation may be performed once, a circuit scale may be greatly reduced as compared with the configuration according to the first embodiment illustrated in FIG. 1.

(Third Embodiment)

Next, a third embodiment will be described. This embodiment relates to a selection algorithm of a threshold value used when the power series operation is selected (the case of FIG. 1) or when the series operation coefficient pair is selected (the case of FIG. 2).

In the above-described selector 102 (case of FIG. 1) or 402 (case of FIG. 4), the (N−1) threshold values Th(i) ($1 \leqq i \leqq N-1$) that are used when selecting the power series directly affects distortion compensation performance of a pre-distortion process using a power series operation. Accordingly, it is effective to observe various signal qualities and determine the threshold values such that the signal qualities are optimized.

Figure 5:
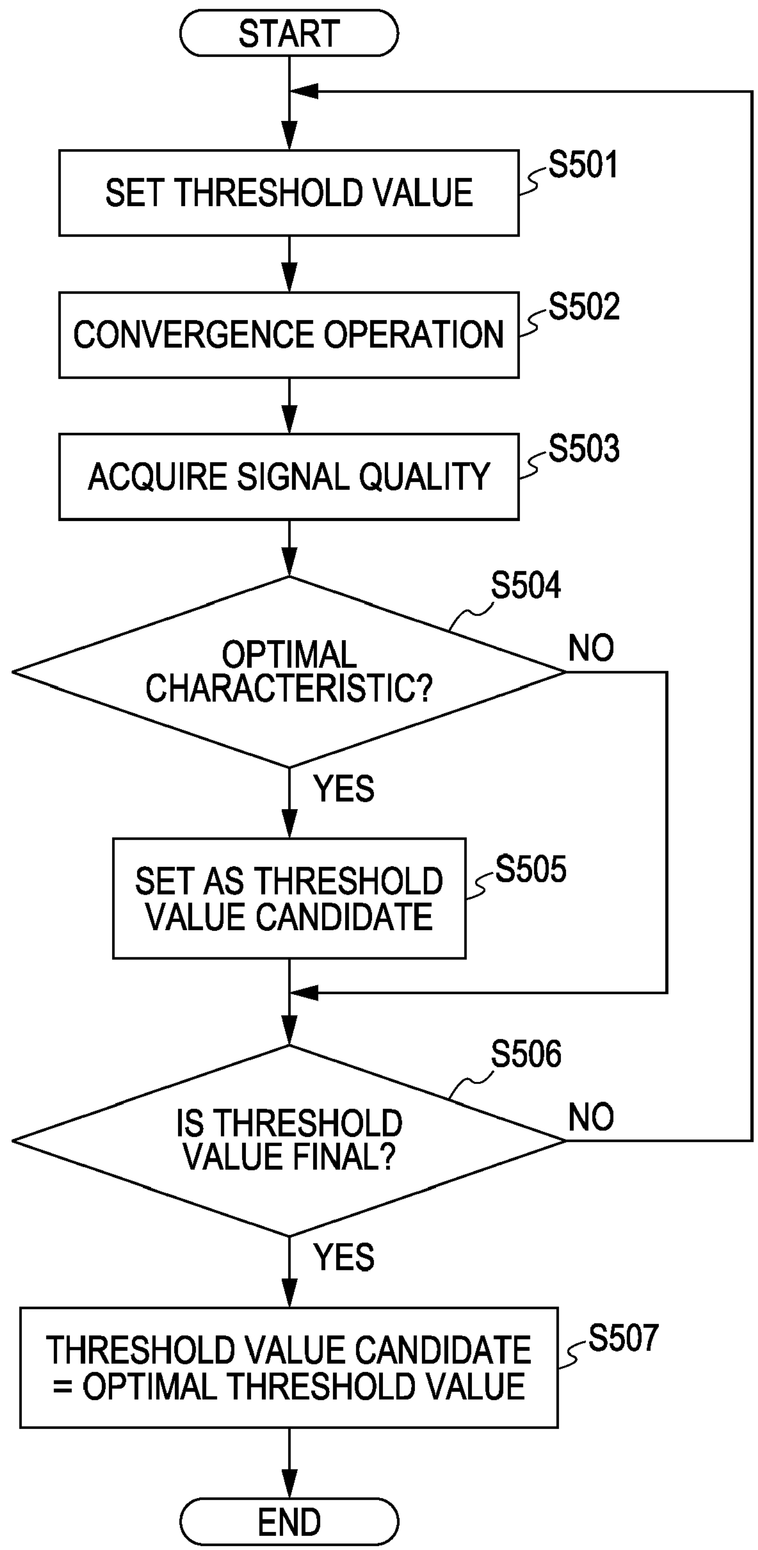
FIG. 5 is an operation flowchart of an algorithm of a threshold value determining process that sequentially calculates a threshold value while observing a signal quality.
Figure 6:
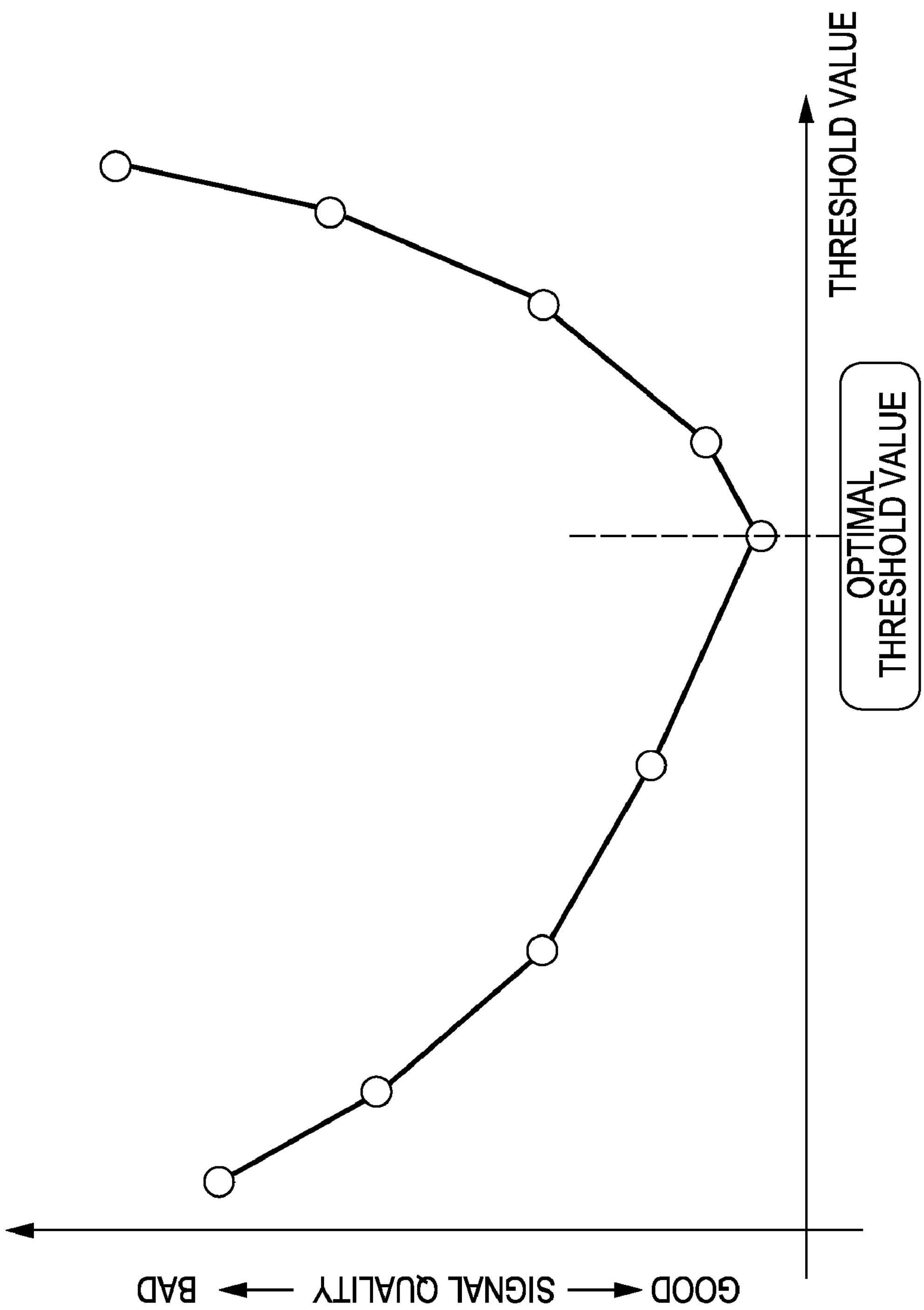
FIG. 6 is a conceptual diagram illustrating the case where an optimal threshold value is calculated.

An operation flowchart of an algorithm of a threshold value determining process that sequentially calculates threshold values while observing signal qualities is illustrated in FIG. 5, and a conceptual diagram of the case where an optimal threshold value is calculated is illustrated in FIG. 6.

During the threshold value determining process, after the threshold value is set (Step S501), a waiting state is maintained until the power series operation coefficient pair is converged by an adaptive algorithm and a distortion compensation operation is properly made (Step S502), and a signal quality in the threshold value is obtained (Step S503).

Next, it is determined whether the signal quality that is obtained in Step S503 is an optimal characteristic (Step S504).

When the signal quality is not the optimal characteristic, a next threshold value is tried (Step S504→S506→S501).

When the signal quality is the optimal characteristic, the threshold value that is set in Step S501 is set as a threshold value candidate (Step S504→S505), and a next threshold value is tried (Step S506→S501).

If the above process is completed with respect to all of the threshold values, the currently selected threshold value candidate is output as the optimal threshold value, and the threshold value determining process is completed (Step S506→S507).

The optimal threshold value that is determined in the above way becomes a threshold value that has an optimal signal quality, as illustrated in FIG. 6.

In the description of the third embodiment illustrated in FIGS. 5 and 6, various elements that become indexes are considered as elements described as the "signal quality". However, if a distortion compensation effect is considered, a scheme where a quality is excellent when out-of-band distortion is minimized and a scheme where a quality is excellent when distortion, namely in-band and out-of-band distortion, is totally minimized may be effectively used. A realization example of the former is illustrated in a fourth embodiment to be described below and a realization example of the latter is illustrated in a fifth embodiment to be described below.

(Fourth Embodiment)

The fourth embodiment will be described. This embodiment is a realization example of a scheme that evaluates the signal quality in the third embodiment according to whether the out-of-band distortion is minimized.

Figure 7:
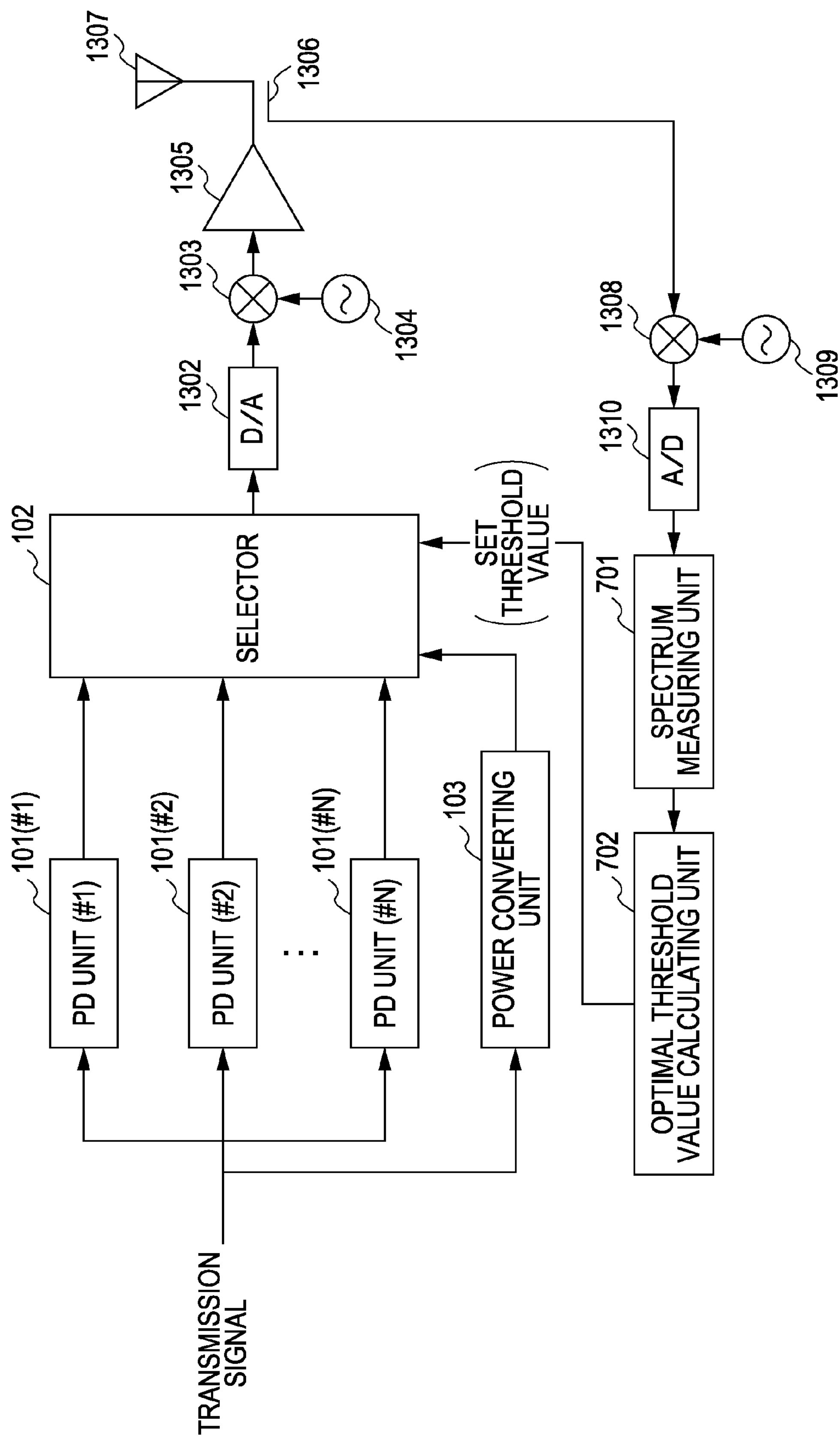
FIG. 7 is a diagram illustrating the configuration of a distortion compensating apparatus according to a fourth embodiment.

FIG. 7 is a diagram illustrating the configuration of a distortion compensating apparatus according to the fourth embodiment.

In FIG. 7, the portions that are denoted by the same reference numerals as those in the first embodiment of FIG. 1 have the same functions as the portions of FIG. 1, and the portions that are denoted by the same reference numerals as those in the related art of FIG. 13 have the same functions as the portions of FIG. 13.

Figure 8:
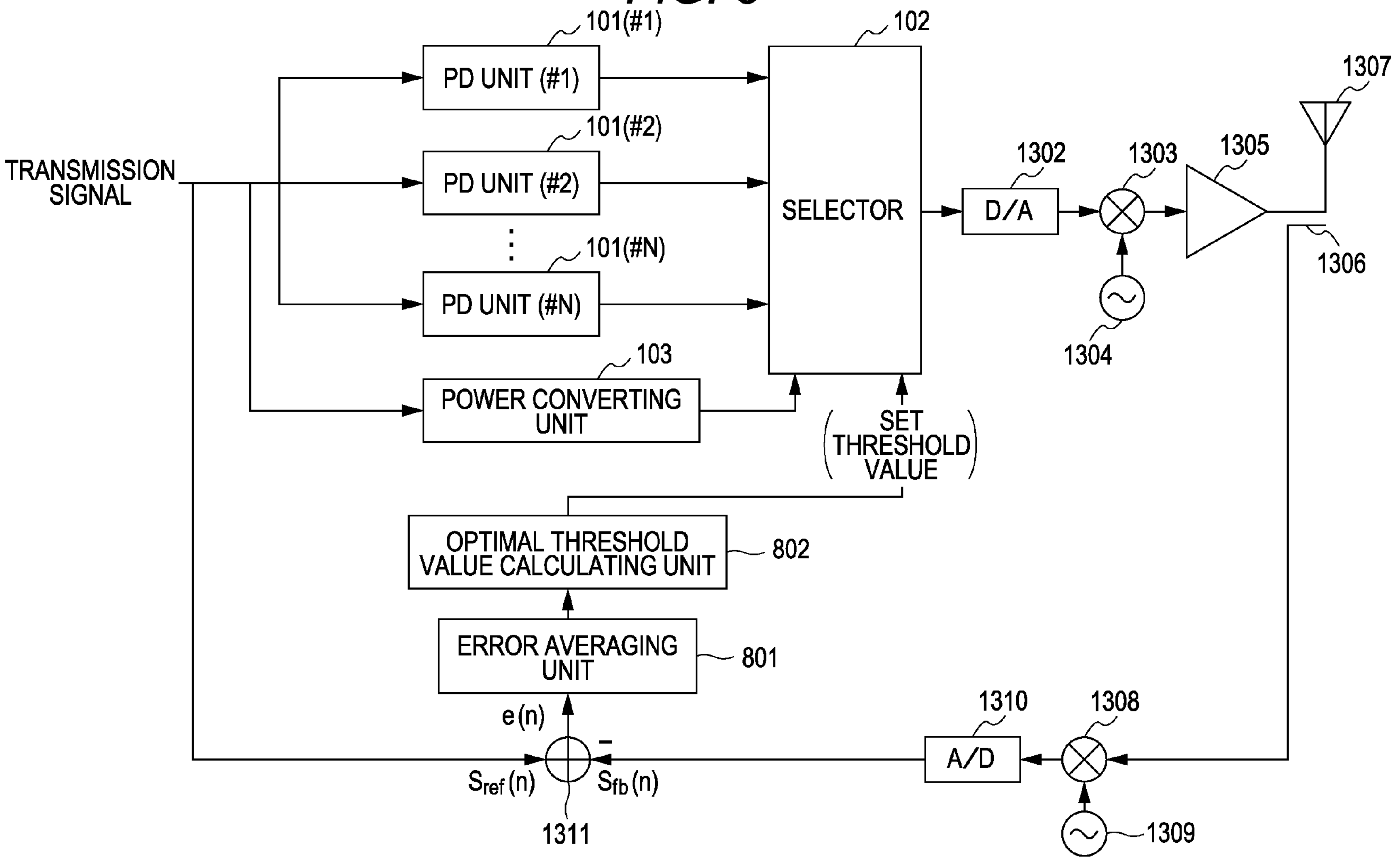
FIG. 8 is a diagram illustrating the configuration of a distortion compensating apparatus according to a fifth embodiment.

The distortion compensating apparatus according to the fourth embodiment further includes a threshold determining unit (e.g., Optimal Threshold Value Calculating Unit) 702 that determines a threshold value of power in a selecting process, which is executed by the selecting unit on the basis of the power of a transmission signal, on the basis of a signal quality corresponding to at least one of the transmission signal and the feedback signal. In this case, the distortion compensating apparatus further includes a frequency characteristic (e.g., spectrum) measuring unit 701 that measures a frequency characteristic of the demodulation signal. The threshold value determining unit 702 determines a threshold value on the basis of the measurement result of the frequency characteristic measuring unit. Alternatively, threshold value determining units 801 or 802 may determine a threshold value on the basis of an error between the demodulation signal and a transmission signal at a previous stage of a circuit performing power amplification, as illustrated in FIG. 8.

Specifically, in FIG. 7, the spectrum measuring unit 701 acquires a spectrum characteristic of a feedback demodulation signal that is output from an A/D converter 1310, and measures out-of-band distortion power.

In addition, the optimal threshold value calculating unit 702 executes a threshold value determining process on the basis of the operation flowchart of FIG. 5 in the above-described third embodiment. In the signal quality acquiring process of Step S503 illustrated in FIG. 5, the optimal threshold value calculating unit 702 acquires the out-of-band distortion power measured by the spectrum measuring unit 701 as the signal quality. In Step S504 of FIG. 5, the optimal threshold value calculating unit 702 determines whether the out-of-band distortion power is minimized and determines whether the signal quality is an optimal characteristic.

The optimal threshold value calculating unit 702 sets the threshold value, which is determined by the above process, as a threshold value used to select each of the PD units 101 of #1 to #N. This threshold value is referred to from the selector 102 when the selecting process is executed on the basis of the operation flowchart illustrated in FIG. 2.

The out-of-band distortion may be calculated by acquiring the spectrum characteristic. In the configuration illustrated in FIG. 7, the optimal threshold value may be calculated by using the algorithm of FIG. 5.

The configuration of the fourth embodiment illustrated in FIG. 7 is based on the configuration of the first embodiment illustrated in FIG. 1. However, even if the configuration of the fourth embodiment were based on the configuration of the second embodiment illustrated in FIG. 4, the same effect may be obtained.

(Fifth Embodiment)

The fifth embodiment will be described. This embodiment is a realization example of a scheme that evaluates the signal quality in the third embodiment according to whether the distortion is totally minimized, as described above.

FIG. 8 is a diagram illustrating the configuration of a distortion compensating apparatus according to a fifth embodiment.

In FIG. 8, the portions that are denoted by the same reference numerals as those in the first embodiment of FIG. 1 have the same functions as the portions of FIG. 1, and the portions that are denoted by the same reference numerals as those in the related art of FIG. 13 have the same functions as the portions of FIG. 13.

The distortion compensating apparatus according to the fifth embodiment further includes a threshold value determining unit (e.g., Optimal Threshold Value Calculating Unit) 802 that determines a threshold value of power in a selecting process, which is executed by the selecting unit on the basis of the power of a transmission signal, on the basis of a signal quality corresponding to at least one of the transmission signal and the feedback signal. In this case, the threshold value determining unit 801 or 802 determines a threshold value on the basis of an error between the demodulation signal and a transmission signal at a previous stage of a circuit performing power amplification.

Specifically, as the distortion, an error signal e(n) that is obtained by subtracting a feedback signal Sfb(n) from a delay transmission signal Sref(n) by a subtractor 1311 may be used as an index.

Accordingly, in FIG. 8, the error averaging unit 801 calculates an average value with respect to the error signal e(n) that is obtained by subtracting the feedback signal Sfb(n) from the delay transmission signal Sref(n) by the subtractor 1311, for each predetermined interval.

In addition, the optimal threshold value calculating unit 802 executes the threshold value determining process on the basis of the operation flowchart of FIG. 5 in the above-described third embodiment. In the signal quality acquiring process of Step S503 illustrated in FIG. 5, the optimal threshold value calculating unit 802 acquires the error average value calculated by the error averaging unit 801 as the signal quality. In Step S504 of FIG. 5, the optimal threshold value calculating unit 802 determines whether the error average value is minimized and determines whether the signal quality is an optimal characteristic.

The optimal threshold value calculating unit 802 sets the threshold value, which is determined by the above process, as a threshold value used to select each of the PD units 101 of #1 to #N. This threshold value is referred to from the selector 102 when the selecting process is executed on the basis of the operation flowchart illustrated in FIG. 2.

The error signal e(n) may be replaced by a characteristic called modulation precision or EVM (Error Vector Magnitude). In general, the EVM is calculated by the following Equation 2 using a delay transmission signal Sref(i) (=Sref (n)) and a feedback signal Sfb(i)(=Sfb(n)).

$$EVM[\%] = \sqrt{\frac{\sum_i |Sref(i) - Sfb(i)|^2}{\sum_i |Sref(i)|^2}} \times 100 \tag{2}$$

The configuration of the fifth embodiment illustrated in FIG. 8 is based on the configuration of the first embodiment illustrated in FIG. 1. However, even if the configuration of the fifth embodiment were based on the configuration of the second embodiment illustrated in FIG. 4, the same effect can be obtained.

(Sixth Embodiment)

The sixth embodiment will be described. This embodiment relates to an adaptive update algorithm of a power series operation coefficient pair.

Figure 9:
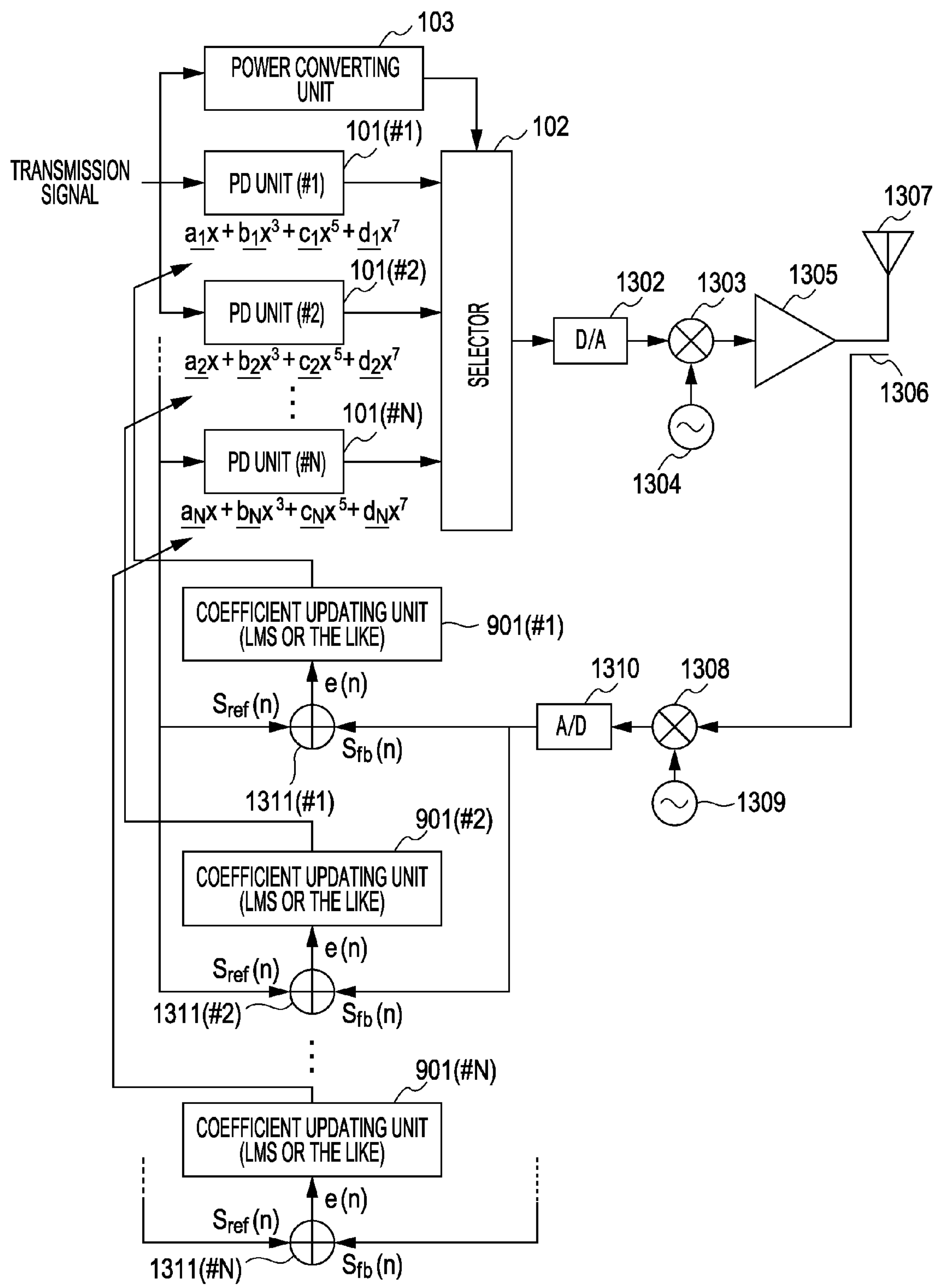
FIG. 9 is a diagram illustrating the configuration of a distortion compensating apparatus according to a sixth embodiment.

FIG. 9 is a diagram illustrating the configuration of a distortion compensating apparatus according to a sixth embodiment.

In FIG. 9, the portions that are denoted by the same reference numerals as those in the first embodiment of FIG. 1 have the same functions as the portions of FIG. 1, and the portions that are denoted by the same reference numerals as those in the related art of FIG. 13 have the same functions as the portions of FIG. 13.

The distortion compensating apparatus according to the sixth embodiment further includes a series operation coefficient pair updating unit 901 that converges each of a plurality of series operation coefficient pairs using an adaptive algorithm such that an error between a demodulation signal and a transmission signal at a previous stage of a circuit performing power amplification is minimized. The series operation coefficient pair updating unit 901 determines a convergence coefficient in the adaptive algorithm with respect to each of the plurality of series operation coefficient pairs in accordance with a signal frequency distribution for every power range to which each pair corresponds. Alternatively, the series operation coefficient pair updating unit 901 may determine a convergence coefficient in the adaptive algorithm with respect to each of the plurality of series operation coefficient pairs in accordance with signal power for every power range to which each pair corresponds.

Specifically, in order to adaptively associate the individual distortion compensation characteristics of the PD units 101 of #1 to #N with a variation in amplification characteristic due to an individual difference of the transmission amplifier 1305 and a variation in amplification characteristic due to a secular change and a temperature change, in the coefficient updating units 901 of #1 to #N, the power series operation coefficient pairs of #1 to #N are updated on the basis of the error signal e(n) output from corresponding subtractors 1311 of #1 to #N, such that each error signal e(n) is minimized on the basis of a least mean square operation.

When the power series operation coefficient pair is updated, an adaptive algorithm that has a small operation amount and that easily adjusts to a temporal variation is generally used. In this embodiment, since the plurality of power series operation coefficient pairs are used, it is effective to properly apply the adaptive algorithm with respect to each of the plurality of power series operation coefficient pairs and converge the coefficient pairs.

As the adaptive algorithm of the power series operation coefficient pair, in addition to the above-described LMS, an algorithm, such as RLS, is generally used (S. Haykin: "adaptive filter logic", technology publication (2001). (Hiroshi Suzuki et al.)). In this algorithm, a constant called a convergence coefficient adjusting a speed until the convergence and stability after the convergence in a trade-off relation is important. For example, if the LMS algorithm is exemplified, an update equation of a coefficient h(n) is represented by the following Equation 3 using the feedback signal Sfb(n) and the error signal e(n) (V. Mathews: "Adaptive polynomial filters", IEEE Signal Processing Magazine, pp. 10-26 (1991)). In this case, μ becomes a convergence coefficient.

$$h(n+1)=h(n)+\mu e(n)Sfb(n) \tag{3}$$

Since magnitude of a coefficient update component of "e(n)Sfb(n)" becomes μ times and is added to a coefficient h(n) at a current point in time and a coefficient h(n+1) at a subsequent point in time is calculated, a convergence speed increases when μ increases. Meanwhile, once the coefficient is converged, the coefficient h(n) does not need to be greatly changed. When μdecreases, stability after the convergence increases.

In this embodiment, the plurality of power series operation coefficient pairs are used. In accordance with a power range of each power series, a convergence speed and stability of each power series operation coefficient pair are varied and optimized, thereby optimizing the stability and the convergence speed of the distortion compensation performance. Accordingly, it is effective to vary the convergence coefficient for each power series operation coefficient pair.

Figure 10:
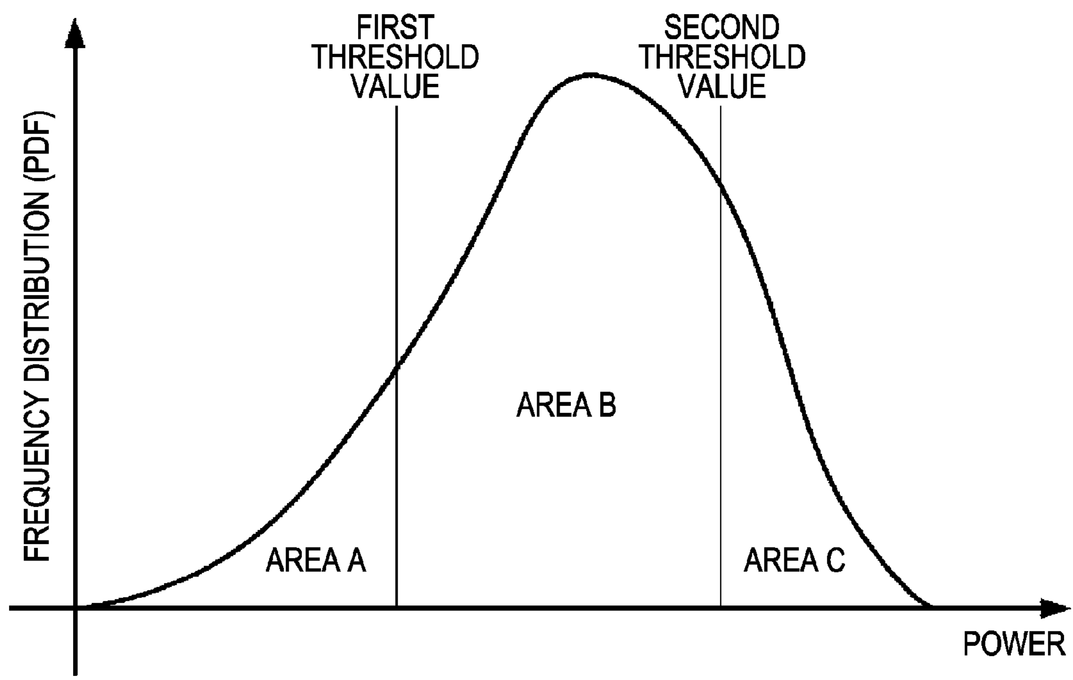
FIG. 10 is a diagram illustrating an example of a relationship between a frequency distribution and a convergence coefficient of a transmission signal in the case where three power series operation coefficient pairs are used.
Figure 11:
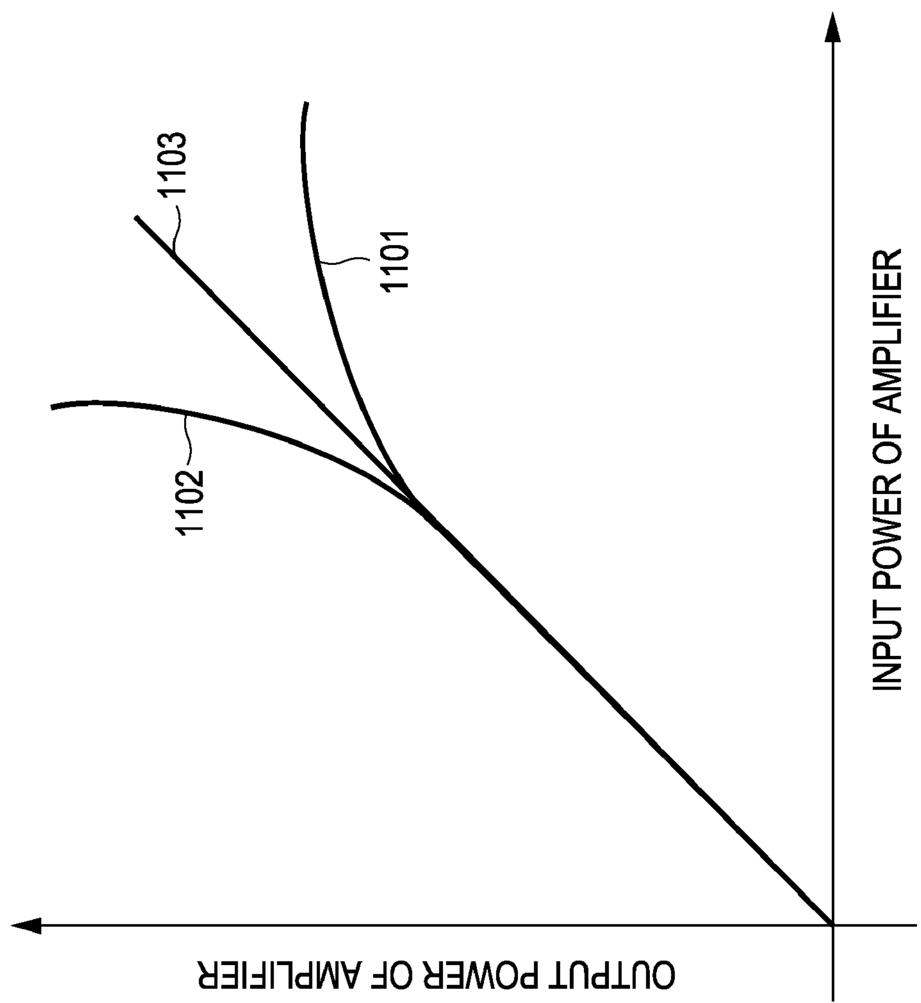
FIG. 11 is a diagram illustrating a principle of a pre-distortion scheme.
Figure 12:
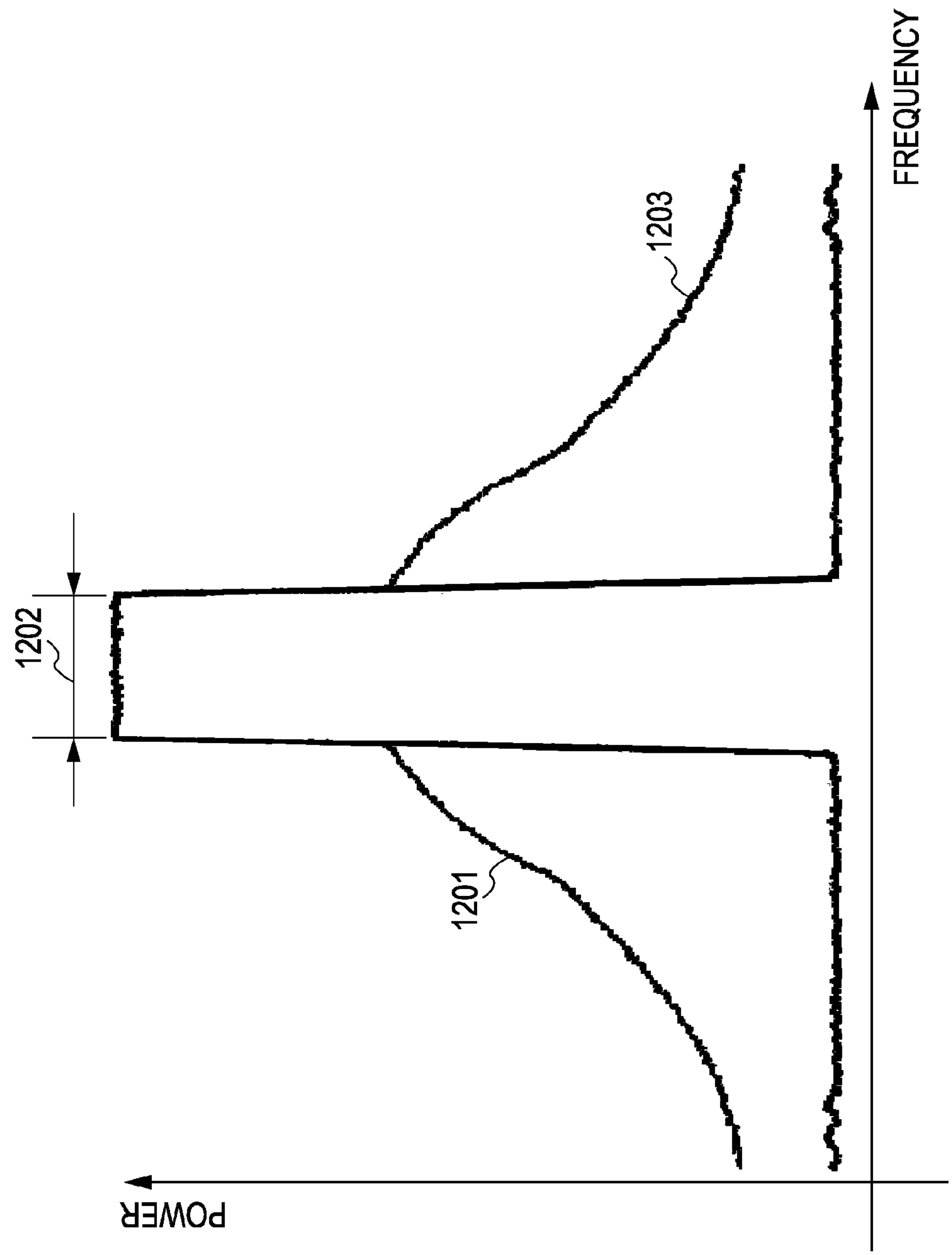
FIG. 12 is a diagram illustrating the case where a spectrum characteristic is deteriorated due to a nonlinear characteristic of a transmission amplifier.

As one of variation references of the convergence coefficients, a scheme where the convergence coefficient is determined in accordance with a frequency distribution of a signal for every power range corresponding to each power series is considered. An example of a relationship between a convergence coefficient and a frequency distribution of a transmission signal in the case where three power series operation coefficient pairs are used is illustrated in FIG. 10. The convergence coefficient that corresponds to each power series operation coefficient pair is determined to be in inverse proportion to a signal frequency of a range of each power series. In order to achieve sufficient distortion compensation performance, all of the power series operation coefficient pairs need to be converged. As a convergence coefficient of a power series corresponding to a range where a frequency is small (an area is small in FIG. 10), μ having a large value is used. As a result, a convergence speed of the corresponding portion is increased, and a convergence time may be shortened.

From another point of view, a scheme where a convergence coefficient is weighted in a power value representing each power range is considered. For example, in the example of FIG. 10, when a first threshold value is Th1 and a second threshold value is Th2, each μ is selected to satisfy the following Equation (4):

$$\text{First coefficient updating unit}\ \mu 1 \propto \frac{2}{3Th_1 - Th_2} \tag{4}$$

$$\text{Second coefficient updating unit}\ \mu 2 \propto \frac{2}{Th_1 - Th_2}$$

$$\text{Third coefficient updating unit}\ \mu 3 \propto \frac{2}{3Th_2 - Th_1}$$

As a result, a smaller μ is used for a larger power portion, and the coefficient updating portion of Equation 3 may be constantly approximated. In this way, the convergence performance and the stability performance of the three power series may be achieved, and superior distortion compensation performance may be obtained.

According to the first to sixth embodiments of the present invention, the threshold value is set to the transmission power and the pre-distortion is performed using the plurality of power series. Therefore, superior distortion compensation performance may be obtained as compared with the case of using a single power series.

The above-described first to sixth embodiments have been described on the basis of the power series model, but the present invention is not limited thereto. The first to sixth embodiments may be applied to various series models.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustration of the superiority and inferiority of the invention. Although the embodiment(s) of the present inventions have been described in detail, it should be understood that various changes, substitutions, and alterations could be made hereto without departing from the spirit and scope of the invention.

What is claimed is:

1. A distortion compensating apparatus comprising:

a processing circuit that calculates each of a plurality of series operation coefficient pairs based on a transmission signal and a feedback signal of an output from an amplifying circuit performing power amplification of the transmission signal, executes a series operation process with respect to the transmission signal based on the plurality of the series operation coefficient pairs as a distortion compensation of the transmission signal, and inputs a result of the series operation process to the amplifying circuit performing the power amplification; and a selecting unit that, on the basis of power of the transmission signal, selects the series operation process to be executed corresponding to one of the plurality of series operation coefficient pairs, and selects one of the plurality of series operation coefficient pairs to be used in the series operation process to be executed.

2. The distortion compensating apparatus according to claim 1, wherein the processing circuit comprises a plurality of series operation processing unit each of which executes the series operation process corresponding to each of the plurality of series operation coefficient pairs with respect to the transmission signal, and the selecting unit selects, as the series operation process to be executed, the series operation process in one of the plurality of the series operation processing unit corresponding to the one of the plurality of series operation coefficient pairs.

3. The distortion compensating apparatus according to claim 1, wherein the processing circuit comprises a series operation coefficient pair storage which stores each of the plurality of series operation coefficient pairs, and the selecting unit selects, as to be used in the series operation process to be executed, the one of the plurality of series operation coefficient pairs from the series operation coefficient pair storage.

4. The distortion compensating apparatus according to claim 1, further comprising:

a threshold value determining unit that determines a threshold value of the power in the selecting process, which is executed by the selecting unit based on the power of the transmission signal, on the basis of a signal quality corresponding to at least one of the transmission signal and the feedback signal.

5. The distortion compensating apparatus according to claim 4, further comprising:

a frequency characteristic measuring unit that measures a frequency characteristic of the feedback signal, wherein the threshold value determining unit determines the threshold value on the basis of the measurement result of the frequency characteristic measuring unit.

6. The distortion compensating apparatus according to claim 4, wherein the threshold value determining unit determines the threshold value on the basis of an error between the feedback signal and the transmission signal.

7. The distortion compensating apparatus according to claim 1, further comprising:

a series operation coefficient pair updating unit that converges each of the plurality of series operation coefficient pairs using an adaptive algorithm, such that an error between the feedback signal and the transmission signal satisfies a given condition.

8. The distortion compensating apparatus according to claim 7, wherein the series operation coefficient pair updating unit determines a convergence coefficient in the adaptive algorithm in accordance with a signal frequency distribution for every power range corresponding to each of the plurality of series operation coefficient pairs, with respect to each pair.

9. The distortion compensating apparatus according to claim 7, wherein the series operation coefficient pair updating unit determines a convergence coefficient in the adaptive algorithm in accordance with signal power for every power range corresponding to each of the plurality of series operation coefficient pairs, with respect to each pair.

10. The distortion compensating apparatus according to claim 1, wherein the series operation process is a power series operation process.

11. A distortion compensating method comprising:

calculating each of a plurality of series operation coefficient pairs based on a transmission signal and a feedback signal of output from a circuit performing power amplification of the transmission signal;

executing a series operation process with respect to the transmission signal based on the plurality of series operation coefficient pairs as a distortion compensation of the transmission signal;

inputting the series operation result to the circuit performing the power amplification; and selecting, on the basis of power of the transmission signal, the series operation process to be executed corresponding to one of the plurality of series operation coefficient pairs, and one of the plurality of series operation coefficient pairs to be used in the series operation process to be executed.

12. The distortion compensating method according to claim 11, wherein the executing includes executing each of a plurality of series operation process corresponding to each of the plurality of series operation coefficient pairs with respect to the transmission signal;

the selecting includes selecting, as the series operation process to be executed, one of the plurality of series operation process corresponding to the one of the plurality of series operation coefficient pairs.

13. The distortion compensating method according to claim 11, wherein the executing includes storing each of the plurality of series operation coefficient pairs in a series operation coefficient pair storage, and the selecting unit selects, as to be used in the series operation process to be executed, the one of the plurality of series operation coefficient pairs from the series operation coefficient pair storage.

14. The distortion compensating method according to claim 11, wherein a threshold value of the transmission power that is used in the selection based on the power of the transmission signal is determined on the basis of a signal quality corresponding to at least one of the transmission signal and the feedback signal.

15. The distortion compensating method according to claim 14, wherein a frequency characteristic of the feedback signal is measured, and the threshold value is determined on the basis of the measurement result of the frequency characteristic, in determining the threshold value.

16. The distortion compensating method according to claim 14, wherein the threshold value is determined on the basis of an error between the feedback signal and the transmission signal in determining the threshold value.

17. The distortion compensating method according to claim 11, wherein each of the plurality of series operation coefficient pairs is converged using an adaptive algorithm, such that an error between the feedback signal and the transmission signal satisfies a given condition, and each of the plurality of series operation coefficient pairs is updated.

18. The distortion compensating method according to claim 17, wherein, in updating each of the plurality of series operation coefficient pairs, a convergence coefficient in the adaptive algorithm is determined in accordance with a signal frequency distribution for every power range corresponding to each of the plurality of series operation coefficient pairs, with respect to each pair.

19. The distortion compensating method according to claim 17, wherein, in updating each of the plurality of series operation coefficient pairs, a convergence coefficient in the adaptive algorithm is determined in accordance with signal power for every power range corresponding to each of the plurality of series operation coefficient pairs, with respect to each pair.

20. The distortion compensating method according to claim 11, wherein the series operation process is a power series operation process.

* * * * *